(12) United States Patent
Kim et al.

(10) Patent No.: US 10,051,368 B2
(45) Date of Patent: Aug. 14, 2018

(54) MOBILE APPARATUS AND CONTROL METHOD THEREOF

(71) Applicant: Samsung Electronics Co., Ltd., Gyeonggi-do (KR)

(72) Inventors: Jun-Tai Kim, Gyeonggi-do (KR); Jung-Eun Han, Gyeonggi-do (KR); Mi-Hyang Kim, Gyeonggi-do (KR); Byoung-Hee Lee, Seoul (KR); Tae-Eon Kim, Seoul (KR); Sun-Young Lee, Chungcheongbuk-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/383,222

(22) Filed: Dec. 19, 2016

(65) Prior Publication Data

US 2017/0099543 A1    Apr. 6, 2017

Related U.S. Application Data

(63) Continuation of application No. 14/984,777, filed on Dec. 30, 2015, now Pat. No. 9,525,942, which is a
(Continued)

(30) Foreign Application Priority Data

Aug. 3, 2012    (KR) ................. 10-2012-0085340

(51) Int. Cl.
  *H03G 5/00*    (2006.01)
  *H04R 3/04*    (2006.01)
  (Continued)

(52) U.S. Cl.
  CPC ............. *H04R 3/04* (2013.01); *H03G 5/165* (2013.01); *H04M 1/03* (2013.01); *H04M 1/035* (2013.01);
  (Continued)

(58) Field of Classification Search
  CPC .... H03G 5/165; H04M 1/035; H04M 11/062; H04M 19/04; H04M 1/03; H04R 1/02; H04R 2499/11; H04R 3/04
  (Continued)

(56) References Cited

U.S. PATENT DOCUMENTS 5,893,068 A    4/1999    Hasegawa
6,809,635 B1    10/2004    Kaaresoja
(Continued)

FOREIGN PATENT DOCUMENTS

CN    1575031    2/2005
CN    1895001    1/2007
(Continued)

OTHER PUBLICATIONS

Taiwanese Search Report dated Jun. 6, 2017 issued in counterpart application No. 102127553, 12, pages.
(Continued)

*Primary Examiner* — Xu Mei
*Assistant Examiner* — Friedrich W Fahnert
(74) *Attorney, Agent, or Firm* — The Farrell Law Firm, P.C.

(57) ABSTRACT

A mobile apparatus and control method thereof are provided, which includes an audio data signal input unit arranged to receive an audio data signal. An audio output unit is arranged to output an audio signal according to the received audio data signal within a first reproduction frequency. A balanced armature is arranged to output an audio signal according to the received audio data signal within a second reproduction frequency band. The second reproduction frequency band is different from the first reproduction frequency band. An audio signal processor is arranged to adjust the first reproduction frequency band and the second reproduction frequency band such that a combination of the
(Continued)

first reproduction frequency band and the second reproduction frequency band is wider than the first reproduction frequency band and the second reproduction frequency band individually.

12 Claims, 15 Drawing Sheets

Related U.S. Application Data continuation of application No. 13/959,238, filed on Aug. 5, 2013, now Pat. No. 9,241,215.

(51) Int. Cl.
H04M 1/03 (2006.01)
H04M 11/06 (2006.01)
H04M 19/04 (2006.01)
H03G 5/16 (2006.01)
H04R 1/02 (2006.01)

(52) U.S. Cl.
CPC ......... *H04M 11/062* (2013.01); *H04M 19/04* (2013.01); *H04R 1/02* (2013.01); *H04R 2499/11* (2013.01)

(58) Field of Classification Search
USPC .......... 381/74, 111, 150, 345, 356, 380, 386
See application file for complete search history.

(56) References Cited

U.S. PATENT DOCUMENTS

| | | |
|---|---|---|
| 2002/0142795 A1 | 10/2002 | Imahori et al. |
| 2004/0252856 A1 | 12/2004 | Masuda |
| 2005/0025330 A1 | 2/2005 | Saikl et al. |
| 2005/0149339 A1 | 7/2005 | Tanaka |
| 2005/0190928 A1 | 9/2005 | Noto |
| 2007/0127738 A1 | 6/2007 | Yamada et al. |
| 2007/0223735 A1 | 9/2007 | LoPresti et al. |
| 2008/0063223 A1 | 3/2008 | van Halteren et al. |
| 2008/0076489 A1* | 3/2008 | Rosener ............ H04M 1/6066 455/575.2 |
| 2008/0082321 A1 | 4/2008 | Ide |
| 2008/0152175 A1 | 6/2008 | Kim et al. |
| 2008/0159563 A1 | 7/2008 | Moon |
| 2009/0060245 A1 | 3/2009 | Blanchard et al. |
| 2009/0232341 A1* | 9/2009 | Pinter ................. H04R 25/407 381/380 |
| 2010/0246803 A1 | 9/2010 | Tashiro et al. |
| 2011/0173006 A1 | 7/2011 | Nagel et al. |
| 2011/0194720 A1 | 8/2011 | Bergere et al. |
| 2011/0238193 A1 | 9/2011 | Yana et al. |
| 2012/0033818 A1 | 2/2012 | De Poortere |
| 2012/0087533 A1 | 4/2012 | Nageno et al. |
| 2012/0321120 A1* | 12/2012 | Han ........................ H04R 9/06 381/387 |
| 2013/0315415 A1* | 11/2013 | Shin ........................ H04R 3/02 381/74 |
| 2013/0336513 A1* | 12/2013 | Darlington ........... H04R 1/1083 381/380 |
| 2014/0341394 A1 | 11/2014 | Croft, III |

FOREIGN PATENT DOCUMENTS

| | | | |
|---|---|---|---|
| CN | 101137248 | 3/2008 | |
| CN | 101411211 | 4/2009 | |
| CN | 101853659 | 10/2010 | |
| CN | 102089816 | 6/2011 | |
| CN | 102415105 | 4/2012 | |
| EP | 0 630 108 | 12/1994 | |
| EP | 1 499 157 | 1/2005 | |
| JP | 2002-300698 | 10/2002 | |
| WO | WO 2010/122441 | 10/2010 | |
| WO | WO 2012102464 A1 * | 8/2012 | ............... H04R 3/02 |

OTHER PUBLICATIONS

European Search Report dated Jul. 14, 2017 issued in counterpart application No. 13178902.6-1875, 8 pages.
Chinese Office Action dated Aug. 14, 2017 issued in counterpart application No. 201310336763.9, 25 pages.
Korean Office Action dated Feb. 22, 2018 issued in counterpart application No. 10-2012-0085340, 9 pages.

* cited by examiner

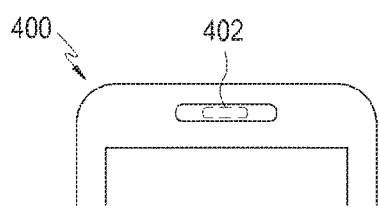
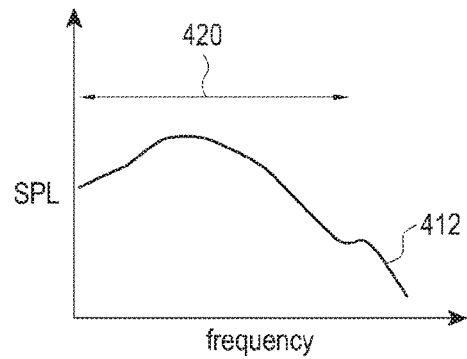
FIG.4A　　　　FIG.4B
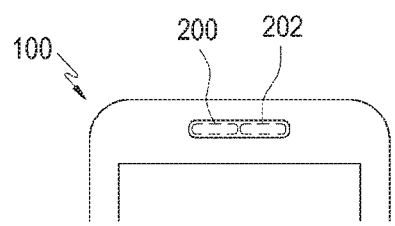
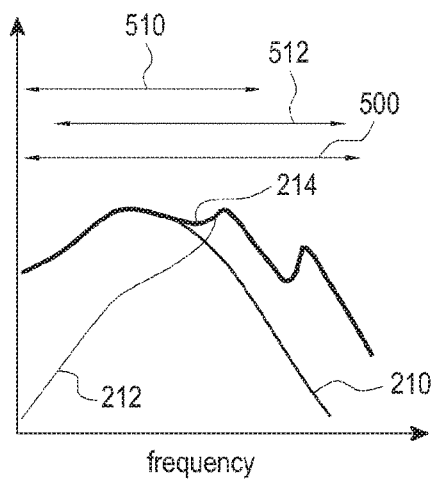
FIG.5A　　　　FIG.5B

MOBILE APPARATUS AND CONTROL METHOD THEREOF

PRIORITY

This application claims priority under 35 U.S.C. § 120 to U.S. application Ser. No. 14/984,777, filed on Dec. 30, 2015, issuing on Dec. 20, 2016 as U.S. Pat. No. 9,525,942, and claiming priority under 35 U.S.C. § 120 to U.S. application Ser. No. 13/959,238, filed on Aug. 5, 2013, issuing on Jan. 19, 2016 as U.S. Pat. No. 9,241,215, and claiming priority under 35 U.S.C. § 119(a) to Korean App. Ser. No. 10-2012-0085340, which was filed in the Korean Intellectual Property Office on Aug. 3, 2012, the entire contents of each of which are incorporated herein by reference.

BACKGROUND OF THE INVENTION

1. Field of the Invention

The present invention relates generally to a mobile apparatus and a control method thereof, and more particularly, to a balanced armature for effective output and reproduction of an audio data signal.

2. Description of the Related Art

With the development of communication technology for a mobile apparatus, a reproduction frequency band for an audio data signal output from the mobile apparatus has been widened.

However, a small audio output means is typically attached to the mobile apparatus to increase the portability of the mobile apparatus. However, the small audio output means produces a sound that is limited to a reproduction frequency band corresponding to a receiving sound of a telephone call, and not the widened reproduction frequency band described above.

SUMMARY OF THE INVENTION

The present invention has been made to address at least the above problems and/or disadvantages and to provide at least the advantages described below. Accordingly, an aspect of the present invention provides a mobile apparatus that includes a balanced armature to output an audio data signal, and a control method thereof.

Another aspect of the present invention provides a mobile apparatus that includes a balanced armature, which adjusts a reproduction frequency band for each of audio output means through an audio signal processor and outputs an audio data signal, and a control method thereof.

In accordance with an aspect of the present invention there is provided a mobile apparatus, comprising: an audio data signal input unit arranged to receive an audio data signal; an audio output unit arranged to output an audio signal according the received audio data signal within a first reproduction frequency band; a balanced armature arranged to output an audio signal according to the received audio data signal within a second reproduction frequency band, the second reproduction frequency band being different from the first reproduction frequency band; and an audio signal processor arranged to adjust the first reproduction frequency band and the second reproduction frequency band such that a combination of the first reproduction frequency band and the second reproduction frequency band is wider than the first reproduction frequency band and the second reproduction frequency band individually.

In one embodiment, a mobile apparatus comprises an audio data signal input unit of a mobile apparatus that receives an audio data signal. The mobile apparatus also includes one or more audio output means capable of outputting an audio signal of a first reproduction frequency band of the received audio data signal, and a balanced armature capable of outputting an audio signal of a second reproduction frequency band of the received audio data signal. The second reproduction frequency band being different from the first reproduction frequency band. The apparatus further includes an audio signal processor that adjusts the first reproduction frequency band and the second reproduction frequency band by using one or more filters. A combination of the adjusted first reproduction frequency band and the adjusted second reproduction frequency band is wider than the adjusted first reproduction frequency band and the adjusted second reproduction frequency band individually.

In accordance with another aspect of the present invention there is provided a method of controlling a mobile apparatus, the method comprising the steps of: receiving an audio data signal; adjusting a first reproduction frequency band of an audio output unit and a second reproduction frequency band of a balanced armature, the second reproduction frequency band being different from the first reproduction frequency band, such that a combination of the first reproduction frequency band and the second reproduction frequency band is wider than the first reproduction frequency band and the second reproduction frequency band individually; and outputting an audio signal according to the received audio data signal through an audio output unit within the first reproduction frequency band and through a balanced armature within the second reproduction frequency band.

In one embodiment, a method of controlling a mobile apparatus is provided. An audio data signal is received. A first reproduction frequency band of the received audio data signal and a second reproduction frequency band of the received audio data signal are adjusted by using one or more filters. The second reproduction frequency band is different that the first reproduction frequency band. A combination of the adjusted first reproduction frequency band and the adjusted second reproduction frequency band is wider than the adjusted first reproduction frequency band and the adjusted second reproduction frequency band individually. The audio data signal of the adjusted first reproduction frequency band is output to one or more audio output means, and the audio data signal of the adjusted second reproduction frequency band is output to the balanced armature.

Another aspect of the invention provides a computer program comprising instructions arranged, when executed, to implement a method in accordance with any one of the above-described aspects. A further aspect provides machine-readable storage storing such a program.

BRIEF DESCRIPTION OF THE DRAWINGS

The above and other aspects, features, and advantages of the present invention will be more apparent from the following detailed description when taken in conjunction with the accompanying drawings, in which:

FIGS. 4A and 4B are diagrams illustrating a reproduction frequency band of a mobile apparatus having one audio output means;

FIGS. 5A and 5B are diagrams illustrating a reproduction frequency band of the mobile apparatus, according to an embodiment of the present invention;

DETAILED DESCRIPTION OF EMBODIMENTS OF THE PRESENT INVENTION

Figure 1:
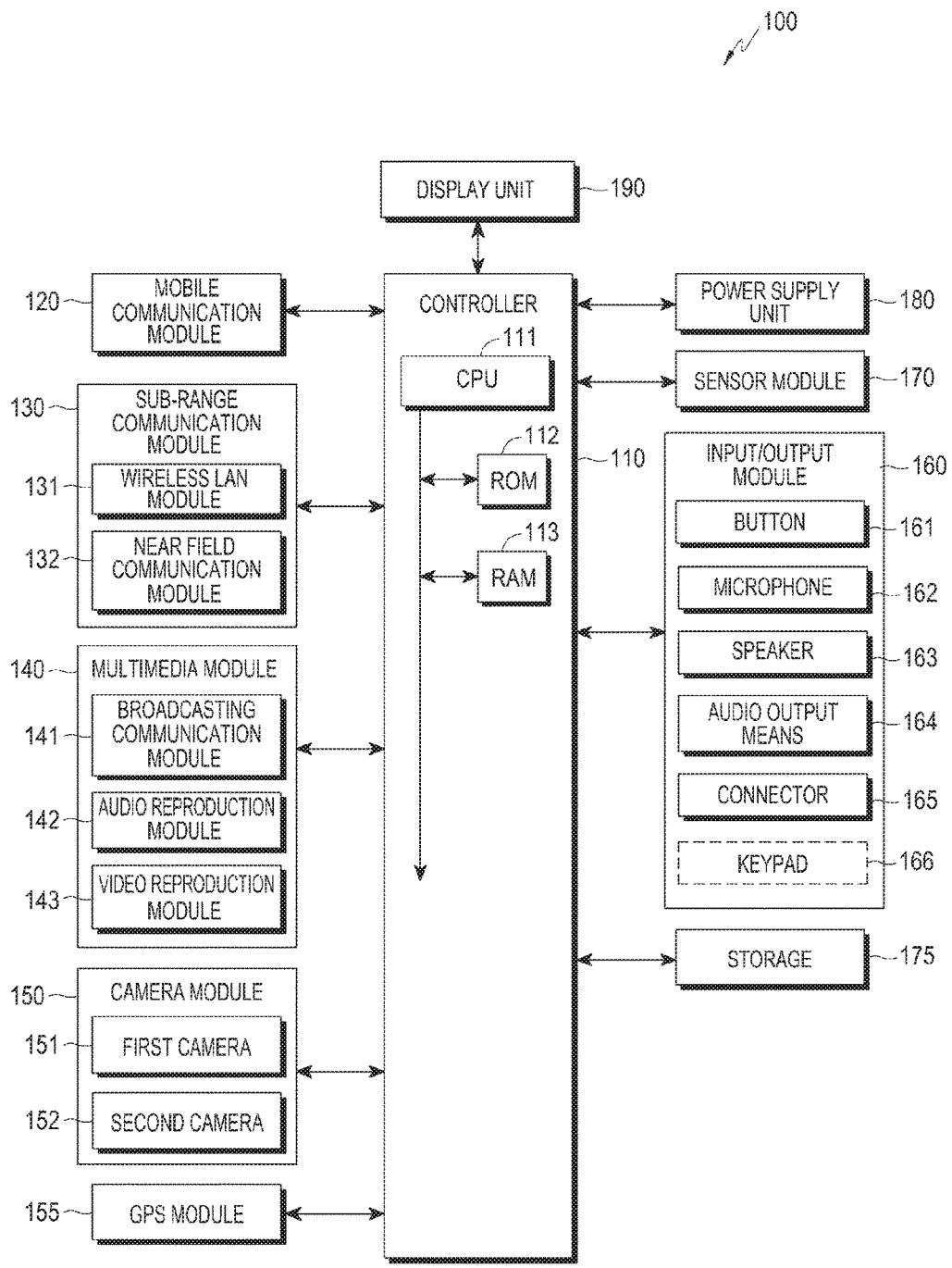
FIG. 1 is a block diagram illustrating a mobile apparatus, according to an embodiment of the present invention.

Embodiments of the present invention are described in detail with reference to the accompanied drawings. The same or similar components may be designated by the same or similar reference numerals although they are illustrated in different drawings. Detailed descriptions of constructions or processes known in the art may be omitted to avoid obscuring the subject matter of the present invention.

Terms including an ordinary number, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element. A term "and/or" includes a combination of multiple relevant described items or any one of the multiple relevant described items.

It should be understood that when one constituent element referred to as being "coupled to" or "connected to" another constituent element, one constituent element can be directly coupled to or connected to the other constituent element, but intervening elements may also be present. In contrast, when one constituent element is "directly coupled to" or "directly connected to" another constituent element, it should be understood that there are no intervening element present.

Terms used in the present application are used only to describe specific embodiments, and are not intended to limit the present invention. Singular expressions used herein include plural expressions unless they have definitely opposite meanings. In the present application, it will be appreciated that terms "including" and "having" are intended to designate the existence of characteristics, numbers, steps, operations, constituent elements, and components described in the specification or a combination thereof, and do not exclude a possibility of the existence or addition of one or more other specific characteristics, numbers, steps, operations, constituent elements, and components, or a combination thereof in advance.

All terms used herein including technical or scientific terms have the same meanings as meanings that are generally understood by those skilled in the art unless they are differently defined. Terms defined in a generally used dictionary shall be construed as having meanings matching those in the context of a related art, and shall not be construed in ideal or excessively formal meanings unless they are clearly defined in the present application.

Throughout the description and claims of this specification, the words "comprise" and "contain" and variations of the words, for example "comprising" and "comprises", means "including but not limited to", and is not intended to (and does not) exclude other components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers or characteristics described in conjunction with a particular aspect, embodiment or example of the invention are to be understood to be applicable to any other aspect, embodiment or example described herein unless incompatible therewith.

It will be also be appreciated that, throughout the description and claims of this specification, language in the general form of "X for Y" (where Y is some action, activity or step and X is some means for carrying out that action, activity or step) encompasses means X adapted or arranged specifically, but not exclusively, to do Y.

FIG. 1 is a schematic block diagram illustrating a mobile apparatus, according to an embodiment of the present invention.

Referring to FIG. 1, a mobile apparatus 100 may be connected with an external device by using a mobile communication module 120, a sub-range communication module 130, and a connector 165. The external device may be another device, such as, for example, a portable phone, a smart phone, a tablet Personal Computer (PC), and a server.

Referring to FIG. 1, the apparatus 100 includes a controller 110, the mobile communication module 120, the sub-range communication module 130, a multimedia module 140, a camera module 150, a Global Position System (GPS) module 155, an input/output module 160, a sensor module 170, a storage unit 175, a power supply unit 180, and a display unit 190. The sub-range communication module 130 includes at least one of a wireless Local Area Network (LAN) module 131 and a Near Field Communication (NFC) module 132. The multimedia module 140 includes at least one of a broadcasting communication module 141, an audio reproduction module 142, and a video reproduction module 143. The camera module 150 includes at least one of a first camera 151 and a second camera 152. The input/output module 160 includes at least one of a button 161, a microphone 162, a speaker 163, an audio output means 164, a vibration motor 167, the connector 165, and a keypad 166.

The controller 110 may include a Central Processing Unit (CPU) 111, a Read Only Memory (ROM) 112 for storing a control program for controlling the mobile apparatus 100, and a Random Access Memory (RAM) 113 for storing a signal or data input from the outside of the mobile apparatus 100 or used as a storage area for work performed by the mobile apparatus 100. The CPU 111 may include a single core, dual cores, triple cores, or quad cores. The CPU 111, the ROM 112, and the RAM 113 may be connected with each other through an internal bus.

The controller 110 may control the mobile communication module 120, the sub-range communication module 130, the multimedia module 140, the camera module 150, the GPS module 155, the input/output module 160, the sensor module 170, the storage unit 175, the power supply unit 180, and the display unit 190. The controller 110 may include an audio data signal input unit 300 (FIG. 3), an audio signal processor 310 (FIG. 3), a crossover frequency changing unit 900 (FIG. 9), an audio output means use determination unit 1100 (FIG. 11), and a reproduction frequency band adjustment input unit 1110 (FIG. 11), which are described in greater detail below. The audio data signal input unit 300, the audio signal processor 310, the crossover frequency changing unit 900, the audio output means use determination unit 1100, and the reproduction frequency band adjustment input unit 111 may be separately formed, and the controller 110 may control the same.

The mobile communication module 120 permits the mobile apparatus 100 to be connected with an external device through mobile communication by using at least one an antenna or a plurality of antennas according to the control of the controller 110. The mobile communication module 120 transceives a wireless signal for a voice call, a video call, a Short Message Service (SMS), or a Multimedia Messaging Service (MMS) with a portable phone, a smart phone, a tablet PC, or another device having a telephone number input in the mobile apparatus 100.

The sub-range communication module 130 may include at least one of the wireless LAN module 131 and the NFC module 132. For example, the sub-range communication module 130 may include only the wireless LAN module 131, only the NFC module 132, or both the wireless LAN module 131 and the NFC module 132.

The wireless LAN module 131 may be connected to the Internet at a place where a wireless Access Point (AP) is installed according to the control of the controller 110. The wireless LAN module 131 may support the wireless LAN standard (IEEE802.11x) of the Institute of Electrical and Electronics Engineers (IEEE). The NFC module 132 may wirelessly perform NFC between the mobile apparatus 100 and an image forming device, according to the control of the controller 110. The NFC method may include Bluetooth or infrared communication (infrared data association (IrDA)).

The mobile apparatus 100 may include at least one of the mobile communication module 120, the wireless LAN module 131, and the NFC module 132 according to performance. For example, the mobile apparatus 100 may include a combination of the mobile communication module 120, the wireless LAN module 131, and the NFC module 132 according to performance.

The multimedia module 140 may include the broadcasting communication module 141, the audio reproduction module 142, or the video reproduction module 143. The broadcasting communication module 141 may receive a broadcasting signal (for example, a Television (TV) broadcasting signal, a radio broadcasting signal, or a data broadcasting signal) and broadcast additional information (for example, an Electric Program Guide (EPG) or an Electric Service Guide (ESG)) transmitted from a broadcasting station through a broadcasting communication antenna, according to the control of the controller 110. The audio reproduction module 142 may reproduce a digital audio file (for example, a file having a file extension of mp3, wma, ogg, or wav) stored or received according to the control of the controller 110. The video reproduction module 143 may reproduce a digital video file (for example, a file having a file extension of mpeg, mpg, mp4, avi, mov, or mkv) stored or received according to the control of the controller 110. The video reproduction module 143 may reproduce a digital audio file.

The multimedia module 140 may include the audio reproduction module 142 and the video reproduction module 143, but not the broadcasting communication module 141. Further, the audio reproduction module 142 or the video reproduction module 143 of the multimedia module 140 may be included in the controller 110.

The camera module 150 may include at least one of a first camera 151 and a second camera 152 for storing a still image or a video. Further, the first camera 151 or the second camera 152 may include an auxiliary light source (for example, a flash) for providing a light quantity necessary for the photographing. The first camera 151 may be disposed on a front surface of the mobile apparatus 100, and the second camera 152 may be disposed in a rear surface of the mobile apparatus 100. Differently, the first camera 151 and the second camera 152 are adjacently disposed to photograph a 3-dimensional still image or a 3-dimensional video.

The GPS module 155 may receive radio waves from a plurality of GPS satellites, and calculate a position of the mobile apparatus 100 by using a time of arrival of the radio waves from the GPS satellites to the mobile apparatus 100. The position of the mobile apparatus 100 calculated from the GPS module 155 may be expressed with at least one of latitude, longitude, height, and 3-dimensional orientation.

The input/output module 160 may include at least one of a plurality of buttons 161, the microphone 162, the speaker 163, the audio output means 164, the connector 165, the keypad 166, and the vibration motor 167.

The button 161 may be formed on a front surface, a side surface, or a rear surface of a housing of the mobile apparatus 100, and may include at least one of a power/lock button, a volume button, a menu button, a home button, and a back button.

The microphone 162 generates an electrical signal by receiving a voice or a sound according to the control of the controller 110. The microphone 162 may receive a voice of a user for voice communication services.

The speaker 163 may output sounds corresponding to various signals (for example, a wireless signal, a broadcasting signal, a digital audio file, a digital video file, or photography) of the mobile communication module 120, the sub-range communication module 130, the multimedia module 140, or the camera module 150 to the outside of the mobile apparatus according to the control of the controller 110. The speaker 163 may output a sound (for example, a button operation sound or a call connection sound corresponding to a telephone call) corresponding to a function performed by the mobile apparatus 100. One or a plurality of speakers 163 may be formed at an appropriate position or appropriate positions of the housing of the mobile apparatus 100.

The audio output means (receiver) 164 may reproduce an audio data signal according to the mobile communication module 120 and output the reproduced audio data signal to the outside of the mobile apparatus 100, according to the control of the controller 110. One or a plurality of audio output means 164 (also referred to herein as audio output units 164) may be formed at an appropriate position or appropriate positions upon the housing of the mobile apparatus 100.

The connector 165 may be used as an interface for connecting the mobile apparatus 100 and an external device or a power source. Data stored in the storage unit 175 of the mobile apparatus 100 may be transmitted to an external device or data may be received from an external device through a wired cable connected to the connector 165, according to the control of the controller 110. Power may be input or a battery may be charged from the power source through the wired cable connected to the connector 165.

The keypad 166 may receive a key input from the user for the control of the mobile apparatus 100. The keypad 166 includes a physical keypad provided at the mobile apparatus 100 or a virtual keypad displayed on the display unit 190. In some embodiments a physical keypad may not be provided.

The vibration motor may convert an electrical signal to a mechanical vibration, according to the control of the controller 110. For example, in a case where the mobile apparatus 100 in a vibration mode receives a voice call from another device, the vibration motor is operated. One or a plurality of vibration motors may be formed inside the housing of the mobile apparatus 100. The vibration motor may be operated in response to a user's touch motion of touching the display unit 190 and a successive motion of a touch on the display unit 190.

The sensor module 170 includes at least one sensor for detecting a state of the mobile apparatus 100. For example, the sensor module 170 may include a proximity sensor for detecting whether a user approaches the mobile apparatus 100, an illumination sensor for detecting a quantity of light at the vicinity of the mobile apparatus 100, or a motion sensor for detecting an operation of the mobile apparatus 100 (for example, a rotation of the mobile apparatus 100, and acceleration or vibration applied to the mobile apparatus 100). At least one sensor may detect a state of the mobile apparatus 100, generate a signal corresponding to the detection, and transmit the generated signal to the controller 110. The sensor of the sensor module 170 may be added or removed according to performance of the mobile apparatus 100.

The storage unit 175 may store an input/output signal or data in correspondence with an operation of the mobile communication module 120, the sub communication module 130, the multimedia module 140, the camera module 150, the GPS module 155, the input/output module 160, the sensor module 170, and the display unit 190 according to the control of the controller 110. The storage unit 175 may store a control program and applications for the control of the mobile apparatus or the controller 110.

The term "storage unit" includes the storage unit 175, the ROM 112 and the RAM 113 within the controller 110, or a memory card (for example, an SD card and a memory stick) mounted on the mobile apparatus 100. The storage unit may include a non-volatile memory, a volatile memory, a Hard Disk Drive (HDD), or a Solid State Drive (SSD).

The power supply unit 180 may supply power to one or a plurality of batteries disposed in the housing of the mobile apparatus 100, according to the control of the controller 110. One or the plurality of batteries supply power to the mobile apparatus 100. Further, the power supply unit 180 may supply power input from an external power source to the mobile apparatus 100 through the wired cable connected with the connector 165.

The display unit 190 may display an image of the mobile apparatus provided according to the control of the controller 110. The display unit 190 may include a touch screen, and the touch screen may provide user interfaces corresponding to various services (for example, a call, data transmission, broadcasting, and photographing) to the user. The touch screen may transmit an analog signal corresponding to at least one touch input in the user interface to the controller 110. The touch screen may receive at least one touch through a body part of the user (for example, a finger including a thumb) or an input means (for example, a stylus pen) capable of generating a touch. Further, the touch screen may receive a successive motion of one touch among one or more touches. The touch screen may transmit an analog signal corresponding to an input of successive motion of a touch to the controller 110.

In an embodiment of the present invention, a touch is not limited to a contact between the touch screen and the body of the user or the input means capable of generating a touch, and may include a non-contact (for example, a detectable interval between the touch screen and the body of the user or the input means capable of generating a touch is equal to or lower than a predetermined interval). The detectable interval in the touch screen may be changed according to performance or a structure of the mobile apparatus 100. The touch screen may be implemented by, for example, a resistive method, a capacitive method, an infrared method, or an ultrasonic wave (acoustic wave) method.

The controller 110 may convert an analog signal received from the touch screen to a digital signal (for example, X and Y coordinates). The controller 110 may control the display unit 190 by using the digital signal. For example, the controller 110 may allow a shortcut icon displayed on the display unit 190 to be selected or execute the shortcut icon in response to the touch.

Figure 2:
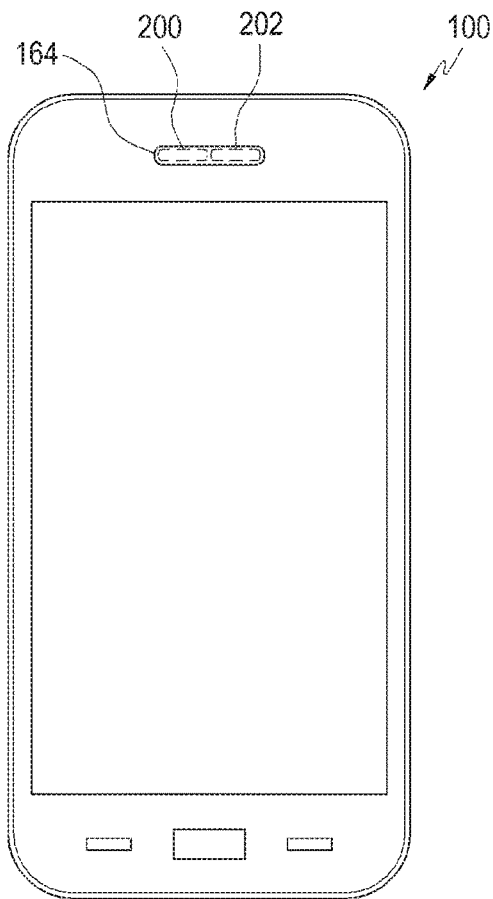
FIG. 2 is a front view of the mobile apparatus, according to an embodiment of the present invention.

FIG. 2 is a front view of the mobile apparatus, according to an embodiment of the present invention.

Referring to FIG. 2, the mobile apparatus 100 includes at least one audio output means 164. The audio output means 164 provides the user with a receiving sound by reproducing the audio data signal and outputting the reproduced audio data signal to the mobile apparatus 100. The mobile apparatus 100 may include a first audio output means 200, a second audio output means 202, a third audio output means, and the like. While FIG. 2 illustrates an example in which two audio output means, including the first audio output means 200 and the second audio output means 202, are provided, the present invention is not limited thereto. Further, the audio output means may be formed from any known type. For instance, the audio output means may comprises a dynamic receiver (also referred to as an ear-piece speaker)

or a balanced armature (commonly used in headphone speakers). Various other types of existing audio output means including receivers may be used as the receiver, and the type of the receiver may be easily recognized by those skilled in the art. The dynamic receiver makes current flow in a coil attached to a vibration plate, vibrates the vibration plate by using a permanent magnet, and reproduces an audio data signal. The dynamic receiver is a type of transducer that uses a vibration plate connected to a central coil vertically moving within a magnetic field generated by a permanent magnet, so that an electrical signal is converted to a sound signal by a vibration of the vibration plate. The dynamic receiver has a characteristic of effectively reproducing a reproduction frequency band of a low band and a middle band. The balanced armature is a type of transducer in which an electrical signal is input in an armature around which a coil is wound, and a connected vibration plate vibrates while moving between permanent magnets, so that a receiving sound is reproduced. The balanced armature has a characteristic of effectively reproducing a reproduction frequency band of a high band. Accordingly, according to an embodiment of the present invention, the reproduction frequency bands of both a low frequency band and a high frequency band are reproduced by simultaneously operating the dynamic receiver reproducing the lower range band and the balanced armature reproducing the high frequency band. Accordingly, a user is effectively provided with a receiving sound in all of the reproduction frequency bands.

Figure 3:
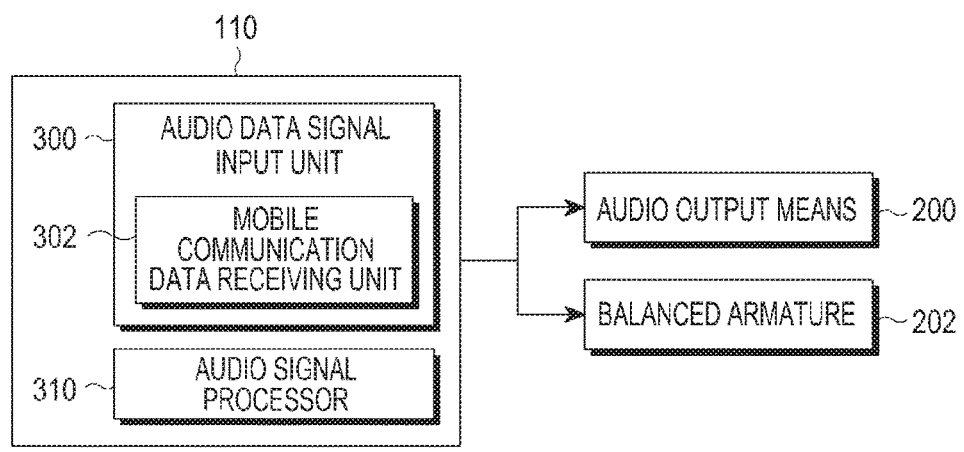
FIG. 3 is an internal block diagram of the mobile apparatus, according to the embodiment of the present invention.

FIG. 3 is an internal block diagram of the mobile apparatus, according to an embodiment of the present invention.

Referring to FIG. 3, the mobile apparatus includes the audio data signal input unit 300, the audio signal processor 310, the at least one audio output means 200, and the balanced armature 202. From the above discussion, that the at least one audio output means 200 may itself be a balanced armature, in which case there would be two balanced armatures. Alternatively, the at least one audio output means may be formed of various receivers, such as, for example, a dynamic receiver and a balanced armature. Accordingly, according to an embodiment of the present invention, an audio data signal may be output through the at least one audio output means 200 and the balanced armature 202, which is one of the types of the audio output means. The balanced armature 202 may be positioned in the vicinity of the at least one audio output means 200. Further, the number of the at least one audio output means 200 may be plural, so that the at least one audio output means 200 may include a first audio output means, a second audio output means, a third audio output means, and an $N^{th}$ audio output means. However, the present invention is described below based on the first audio output means. Further, the audio data signal input unit 300 and the audio signal processor 310 may be included in the controller 110 as illustrated in FIG. 3, or may be separately formed to be controlled by the controller 110.

The audio data signal input unit 300 is included in the mobile apparatus 100, is controlled by the controller 110, and receives an audio data signal. The audio data signal input unit may include a mobile communication data receiving unit 302. The mobile communication data receiving unit 302 may receive the audio data signal by using voice communication services of a mobile communication network. The audio data signal is generated based on a voice frequency band. The audio data signal is an electrical signal including information on a sound reproduced by the audio output means of the mobile apparatus 100 to reproduce a sound such that it is audible to the user outside of the mobile apparatus 100, and provided to the user. For example, the audio data signal may be an electrical signal including information on a voice or a sound of another user of an external mobile apparatus received through the mobile communication data receiving unit 302 using the communication module 120 and 130 of the mobile apparatus 100. A voice or sound signal of another user of the external mobile apparatus is converted to an electrical signal inside the external mobile apparatus, and the converted electrical signal is received in the mobile apparatus 100 through the mobile communication data receiving unit 302 using the communication module. The electrical signal received in the mobile apparatus 100 of the user may be an audio data signal output to the outside of the mobile apparatus and provided to the user.

The first audio output means 200 and the balanced armature 202 receive the audio data signal from the audio signal processor 310 and reproduce the received audio data signal, thereby outputting the audio data signal to the outside of the mobile apparatus and providing the audio data signal to the user. The first audio output means 200 may reproduce a first reproduction frequency band of the audio data signal, and the balanced armature 202 may reproduce a second reproduction frequency band of the audio data signal. The first reproduction frequency band and the second reproduction frequency band may be different from each other, but may have an overlapping band.

FIGS. 4A and 4B are diagrams illustrating a mobile apparatus including an audio output means and a reproduction frequency band of a mobile apparatus including one audio output means. FIGS. 5A and 5B are diagrams illustrating a reproduction frequency band of the mobile apparatus including the balanced armature, according to an embodiment of the present invention. FIG. 4A illustrates a mobile apparatus 400 including one audio output means 402. FIG. 4B illustrates a frequency spectrum 412 of an audio data signal reproduced in the one audio output means 402. In the graph of FIG. 4B, the X-axis is frequency, and the Y-axis isSound Pressure Level (SPL). Accordingly, the graph of FIG. 4B represents the spectrum 412 in which an SPL according to a frequency of the one audio output means 402 is represented. A band reproducible by the one audio output means 402 is designated by reproduction frequency band 420 in FIG. 4B. The reproduction frequency band is considered to be the frequency band in which an audio data signal can be effectively converted to an output audio signal at a sufficiently high volume. The reproduction frequency band can be used to filter an audio data signal before it is passed to the audio output means.

FIG. 5A illustrates the mobile apparatus 100 including the balanced armature, according to an embodiment of the present invention. Further, FIG. 5B illustrates frequency spectrums 210 and 212 of audio data signals reproduced in the first audio output means 200 and the balanced armature 202, respectively. In the graph of FIG. 5B, the X-axis is frequency, and the Y-axis is SPL. Accordingly, the graph of FIG. 5B represents the spectrums 210 and 212 in which SPLs according to frequencies of the first audio output means and the balanced armature are represented. Further, FIG. 5B illustrates a first reproduction frequency band 510 reproduced in the first audio output means 200, and a second reproduction frequency band 512 reproduced in the balanced armature 202. In the mobile apparatus, according to an embodiment of the present invention, the frequency spectrum 210 of the first audio output means 200 is combined with the frequency spectrum 212 of the balanced armature 202 to produce frequency spectrum 214. According to the combined frequency spectrum 214, a reproduction frequency band 500 is wider than the reproduction frequency band 420 of the mobile apparatus having the one audio output means in FIG. 4B. Accordingly, according to an embodiment of the present invention, the reproduction frequency band in which the audio data signal is reproduced is widened by using the plurality of audio output means.

The audio signal processor 310, included in the mobile apparatus 100, is controlled by the controller 110, and adjusts the first reproduction frequency band of the first audio output means 200 and the second reproduction frequency band of the balanced armature 202 by using at least one filter. At least one filter may perform filtering according to a frequency.

Figure 6A:
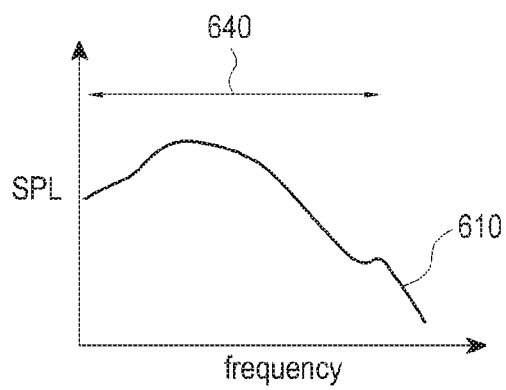
FIGS. 6A to 6C are diagrams illustrating an adjustment of a first reproduction frequency band by an audio signal processor, according to an embodiment of the present invention.
Figure 6B:
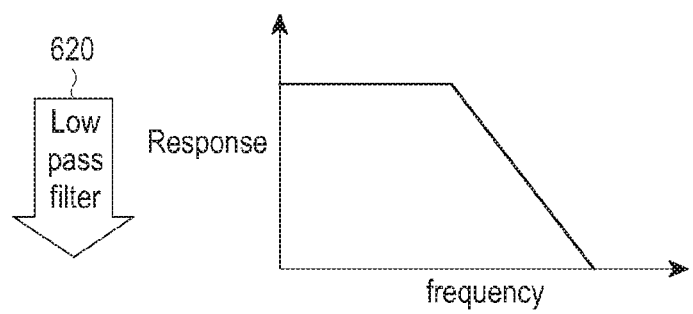
Figure 6C:
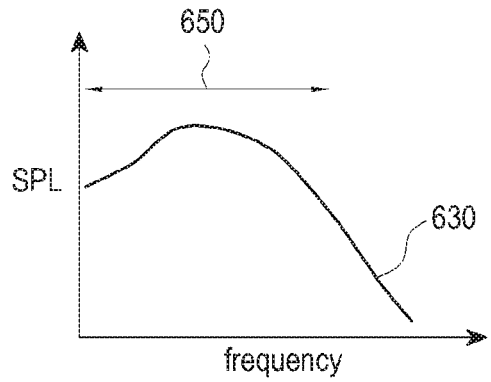
Figure 7A:
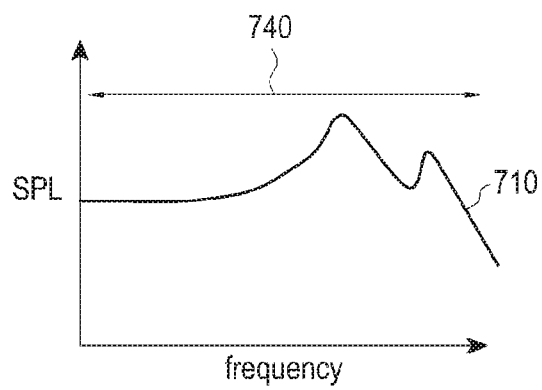
FIGS. 7A to 7C are diagrams illustrating an adjustment of a second reproduction frequency band by an audio signal processor, according to an embodiment of the present invention.
Figure 7B:
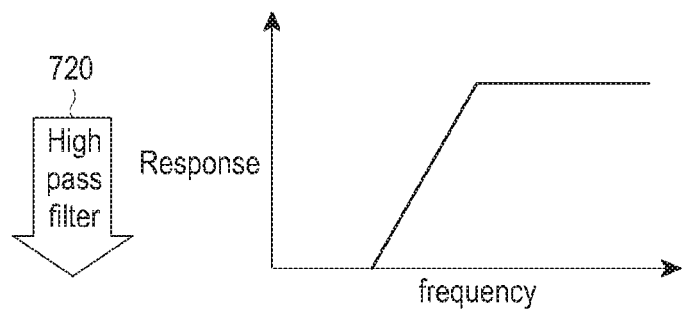
Figure 7C:
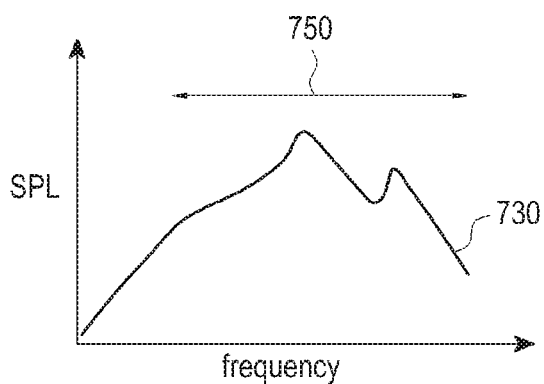

FIGS. 6A to 6C are diagrams illustrating adjustment of the first reproduction frequency band of the first audio output means by the audio signal processor, according to an embodiment of the present invention. FIGS. 7A to 7C are diagrams illustrating adjustment of the second reproduction frequency band of the balanced armature by the audio signal processor, according to an embodiment of the present invention. FIG. 6A illustrates a spectrum 610 representing an SPL according to a frequency of an audio data signal of the first audio output means 200. FIG. 6B illustrates a frequency response graph for a Low Pass Filter (LPF) 620 used in the audio signal processor 310. The audio signal processor 310 may adjust the first reproduction frequency band of the first audio output means by cutting a high frequency band reproduced in the first audio output means 200 and performing filtering for maintaining a low frequency band, by using the LPF illustrated in FIG. 6B. Accordingly, FIG. 6C illustrates a spectrum 630 representing an SPL according to a frequency for the audio data signal filtered by the LPF 620. Comparing a reproduction frequency band 640 before the filtering in FIG. 6A with a reproduction frequency band 650 after the filtering in FIG. 6C, it is evident that the high frequency band is cut and the low frequency band is maintained.

FIG. 7A illustrates a spectrum 710 representing an SPL according to a frequency of an audio data signal of the balanced armature 202. FIG. 7B illustrates a frequency response graph for a High Pass Filter (HPF) 720 used in the audio signal processor 310. The audio signal processor 310 may adjust the second reproduction frequency band of the balanced armature by cutting the low frequency band reproduced in the balanced armature 202 and performing filtering for maintaining the high frequency band, by using the HPF as illustrated in FIG. 7B. Accordingly, FIG. 7C illustrates a spectrum 730 representing an SPL according to a frequency for the audio data signal filtered by the high pass filter 720. Comparing a reproduction frequency band 740 before the filtering in FIG. 7A with a reproduction frequency band 750 after the filtering in FIG. 7C, it is evident that the low frequency band is cut and the high frequency band is maintained.

Figure 8:
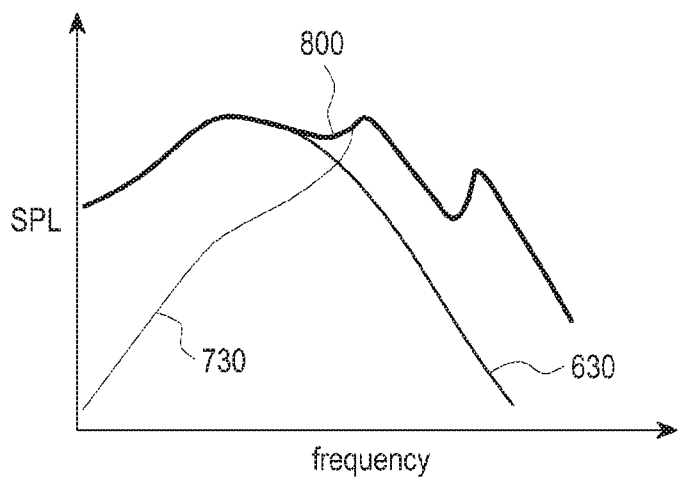
FIG. 8 is a diagram illustrating a frequency spectrum in which a frequency spectrum of the audio output means is combined with a frequency spectrum of a balanced armature, according to an embodiment of the present invention.

FIG. 8 represents a frequency spectrum 800 in which the frequency spectrum 630 of the first audio output means and the frequency spectrum 730 of the balanced armature are combined. Accordingly, when the audio data signal is reproduced by the first audio output means and the balanced armature, according to an embodiment of the present invention, the audio data signal may be reproduced without a dip in the wide reproduction frequency band, as illustrated in FIG. 8. Accordingly, the mobile apparatus including the balanced armature, according to an embodiment of the present invention, may advantageously reproduce the audio data signal by adjusting the reproduction frequency band for each of the plurality of audio output means through the audio signal processor.

Figure 9:
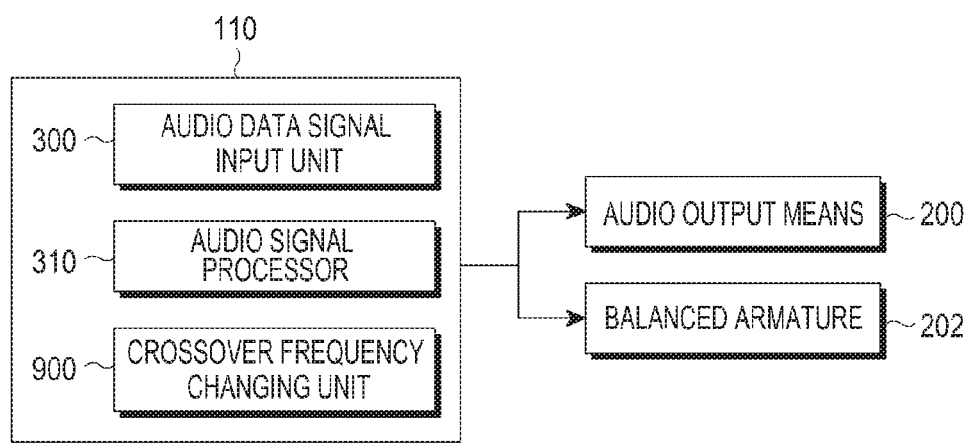
FIG. 9 is an internal block diagram of a mobile apparatus, according to an embodiment of the present invention.

FIG. 9 is an internal block diagram of a mobile apparatus, according to an embodiment of the present invention.

Referring to FIG. 9, the mobile apparatus includes the crossover frequency changing unit 900, in addition to the audio data signal input unit 300, the audio signal processor 310, the at least one audio output means 200, and the balanced armature 202. The crossover frequency changing unit 900 may be included in the controller 110, or may be separately provided to be controlled by the controller 110. The audio data signal input unit 300, the audio signal processor 310, the audio output means 200, and the balanced armature 202 are the same as those described above with respect to FIGS. 3 to 8.

The crossover frequency changing unit 900 changes a crossover frequency at which a frequency response of a first filter used for adjusting the reproduction frequency band of the first audio output means crosses a frequency response of a second filter used for adjusting the reproduction frequency band of the balanced armature, by the audio signal processor.

Figure 10A:
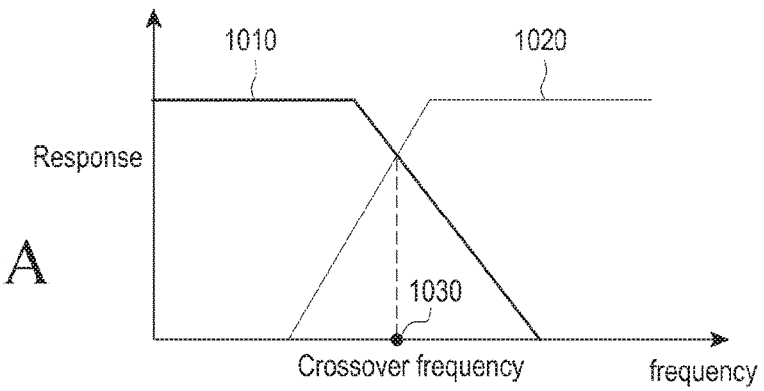
FIGS. 10A to 10C are diagrams illustrating crossover frequencies, according to an embodiment of the present invention.
Figure 10B:
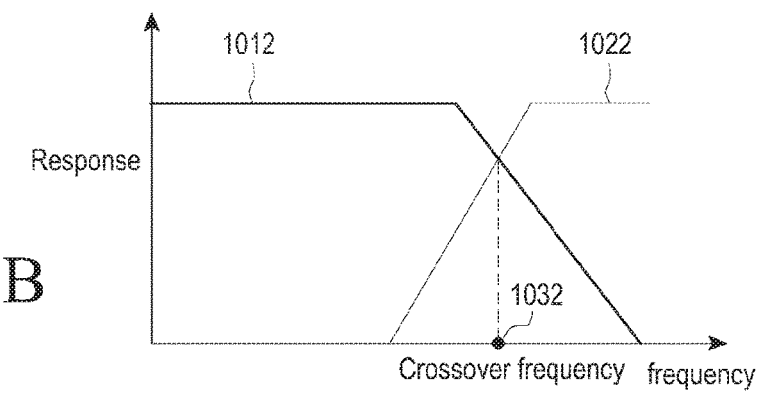
Figure 10C:
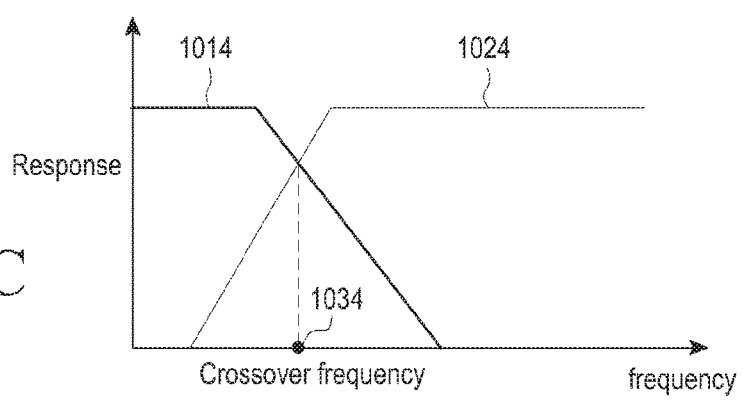

FIGS. 10A to 10C are diagrams illustrating crossover frequencies, according to an embodiment of the present invention. FIG. 10A represents a frequency response 1010 of the first filter used for adjusting the reproduction frequency band of the first audio output means and a frequency response 1020 of the second filter used for adjusting the reproduction frequency band of the balanced armature, by the audio signal processor. A frequency at a point at which the frequency response 1010 of the first filter crosses the frequency response 1020 of the second filter is a crossover frequency 1030. The crossover frequency changing unit 900 may increase or decrease the crossover frequency by changing the crossover frequency. FIG. 10B illustrates an example in which the crossover frequency is increased. When increased to crossover frequency 1032, an application range of a frequency response 1012 of the first filter used for adjusting the reproduction frequency band of the first audio output means is widened compared to that of FIG. 10A. Additionally, an application range of a frequency response 1022 of the second filter used for adjusting the reproduction frequency band of the balanced armature is narrowed compared to that of FIG. 10A. Thus, when the crossover frequency is increased, as shown in FIG. 10B, the application range of the low pass filter, which is the first filter, is widened, and the application range of the high pass filter, which is the second filter, is narrowed. The application of the low pass filter is increased compared to that of FIG. 10A, and the low frequency band is emphasized and filtered. Accordingly, the low frequency band is emphasized and reproduced in the first audio output means and the balanced armature, so that the audio data signal may be output to the user.

FIG. 10C illustrates an example in which the crossover frequency is decreased. When decreased to crossover frequency 1034, an application range of a frequency response 1014 of the first filter used for adjusting the reproduction frequency band of the first audio output means is narrowed compared to that of FIG. 10A. Additionally, an application range of a frequency response 1024 of the second filter used for adjusting the reproduction frequency band of the balanced armature is widened compared to that of FIG. 10A. Thus, when the crossover frequency is decreased, as shown in FIG. 10C, the application range of the low pass filter, which is the first filter, is narrowed, and the application range of the high pass filter, which is the second filter, is widened. The application range of the high pass filter is increased compared to that of FIG. 10A, and the high frequency band is emphasized and filtered. Accordingly, the high frequency band is emphasized and reproduced in the first audio output means and the balanced armature, so that the audio data signal may be output to the user. According to another embodiment of the present invention, it is possible to operate the receiver by changing the emphasized range band through the change in the crossover frequency. Further, the change of the crossover frequency may be determined by receiving an input of the user.

Figure 11:
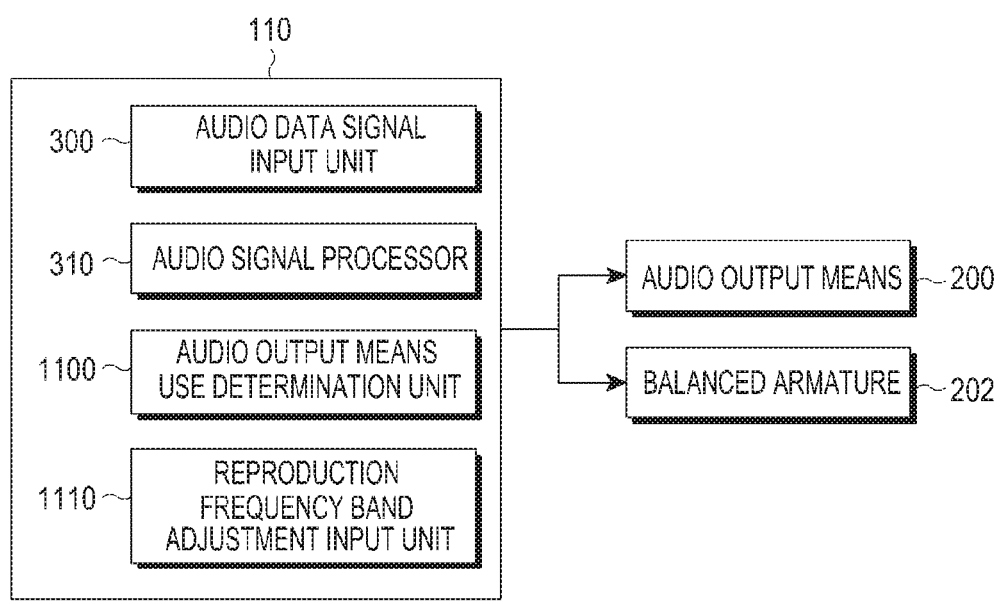
FIG. 11 is an internal block diagram of a mobile apparatus, according to an embodiment of the present invention.

FIG. 11 is an internal block diagram of a mobile apparatus, according to an embodiment of the present invention.

Referring to FIG. 11, the mobile apparatus further includes an audio output means use determination unit 1100 and a reproduction frequency band adjustment input unit 1110, in addition to the audio data signal input unit 300, the audio signal processor 310, the at least one audio output means 200, and the balanced armature 202 shown in FIG. 3. Each of the audio output means use determination unit 1100 and the reproduction frequency band adjustment input unit 1110 may be included in the controller 110, or may be separately formed to be controlled by the controller 110. The audio data signal input unit 300, the audio signal processor 310, the audio output means 200, and the balanced armature 202 are the same as those described in detail above with respect to FIGS. 3 to 8.

The audio output means use determination unit 1100 determines whether to use the first audio output means 200 and the balanced armature 202. Accordingly, when the audio output means use determination unit 1100 determines to use the first audio output means 200 and not to use the balanced armature 202, the audio data signal may be reproduced only in the first audio output means and then provided to the user. Whether to use each audio output means may be determined by receiving an input from the user.

The reproduction frequency band adjustment input unit 1110 receives an input for adjusting the first reproduction frequency band of the first audio output means 200 and the second reproduction frequency band of the balanced armature 202. An input for adjusting the first reproduction frequency band of the first audio output means 200 and the second reproduction frequency band of the balanced armature 202 may be received from the user through the reproduction frequency band adjustment input unit 1110. The reproduction frequency band adjustment input unit 1110 may receive an input for adjusting the first reproduction frequency band of the first audio output means 200 and the second reproduction frequency band of the balanced armature 202 from the user by using the buttons 161, the keypad 166, or the touch screen included in the input module 160 of the mobile apparatus 100.

The mobile apparatus including the balanced armature, according to another embodiment of the present invention, may further include a wide band determination unit for determining whether wide band voice call services, in which a wide band reproduction frequency band is supported, are available in the mobile apparatus.

The wide band reproduction frequency band has an audio data signal reproduction frequency band wider than a narrow band reproduction frequency band. The wide band reproduction frequency band may be 50 to 7,000 Hz, and the narrow band reproduction frequency band may be 300 to 3,400 Hz. Further, whether voice channel information on the audio data signal is the wide band reproduction frequency band may be determined through communication with a base station or by determining a carrier by using the communication modules 120 and 132 or the GPS module 155 included in the mobile apparatus.

The controller 110 may receive information indicating that the wide band voice call services in which the wide band reproduction frequency band is supported are available in the mobile apparatus from the wide band determination unit by controlling the wide band determination unit. For example, a case where the first audio output means 200 reproducing the first reproduction frequency band is the dynamic receiver for reproducing a low frequency band, and the balanced armature 202 reproducing the second reproduction frequency band reproduces a high frequency band is described in detail below. The controller 110 uses all of the first audio output means 200 and the balanced armature 202 by controlling the audio output means use determination unit 1100 described in FIG. 11. The reproduction for the high frequency band, as well as the low frequency band, is supported in the wide band reproduction frequency band, so that it is necessary to use both the first audio output means 200 and the balanced armature 202.

The controller 110 may adjust the first reproduction frequency band by using the low pass filter for the dynamic receiver, which is the first audio output means, and the second reproduction frequency band by using the high pass filter for the balanced armature, by controlling the audio signal processor 310.

Figure 12A:
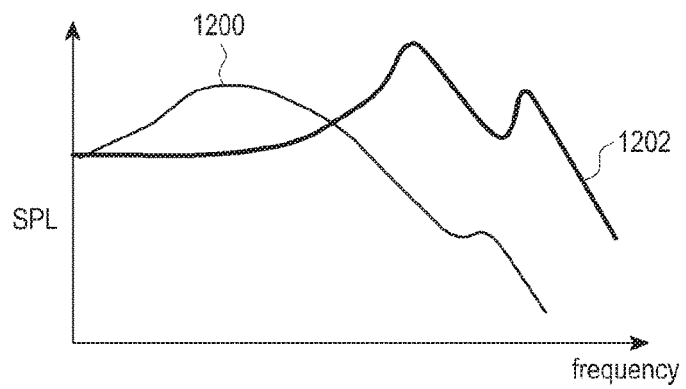
FIG. 12A to 12C are diagrams illustrating a frequency spectrum during reproduction of a wide band, according to an embodiment of the present invention.

A spectrum 1200 representing an SPL according to the frequency for the first audio output means 200 and a spectrum 1202 representing an SPL according to the frequency for the balanced armature are illustrated in FIG. 12A.

Figure 12B:
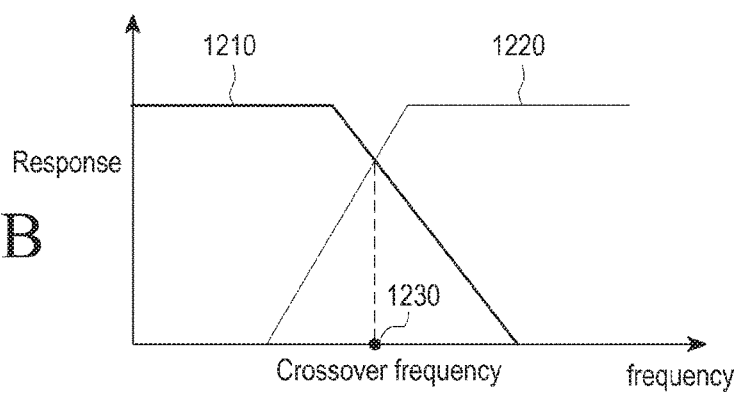

A frequency response 1210 for the low pass filter used in the first audio output means 200 and a frequency response 1220 for the high pass filter used in the balanced armature 202 are illustrated in FIG. 12B. A frequency at a point at which the frequency response 1210 for the low pass filter used in the first audio output means 200 crosses the frequency response 1220 for the high pass filter used in the balanced armature 202 is illustrated as a crossover frequency 1230.

Figure 12C:
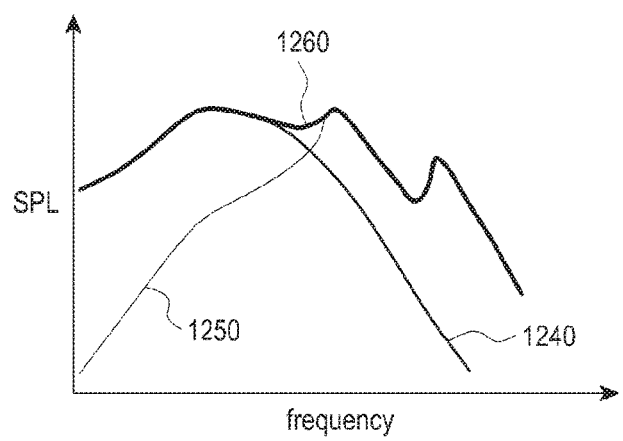

A spectrum 1240 representing an SPL according to the frequency for the first reproduction frequency band, a spectrum 1250 representing an SPL according to the frequency for the adjusted second reproduction frequency band, and a spectrum 1260 representing an SPL according to the frequency in which the first reproduction frequency band is combined with the second reproduction frequency band, are illustrated in FIG. 12C.

Accordingly, referring to FIGS. 12A-12C, when the wide band voice communication services in which the wide band reproduction frequency band is supported are available in the mobile apparatus, the controller 110 may adjust the reproduction frequency band for the first audio output means and the balanced armature by controlling the audio signal processor 310. The audio data signal for the low frequency band and the high frequency band are then reproduced and the user is provided with the reproduced audio data signal as illustrated in FIG. 12C.

Further, the controller 110 may receive information indicating that the wide band voice call services in which the wide band reproduction frequency band is supported are not available in the mobile apparatus from the wide band determination unit by controlling the wide band determination unit. In this case, the controller 110 may output the entire reproduction frequency bands of the audio data signal received in any one of the first audio output means 200 or the balanced armature 202. For example, the controller 110 may receive the information indicating that the first audio output means 200 is used and the balanced armature 202 is not used from the audio output means use determination unit 1100. Since a region in which the wide band reproduction frequency band is not supported corresponds to a narrow band reproduction frequency band, and a relatively narrow high frequency band is supported in the narrow band reproduction frequency band, the audio output means use determination unit 1100 may transmit the information indicating that the balanced armature corresponding to the high frequency band is not used to the controller 110.

However, even when the controller 110 receives the information indicating that the mobile apparatus is positioned in a region in which the wide band reproduction frequency band is not supported from the wide band determination unit by controlling the wide band determination unit, the controller 110 may receive the information indicating that the balanced armature 202 is used from the audio output means use determination unit 1100. This may occur when the high frequency band is supported by a predetermined region even in a case where the mobile apparatus is present in the narrow band reproduction frequency band. The controller 110 may decrease the crossover frequency by controlling the crossover frequency determination unit 900. When the crossover frequency is decreased, the reproduction for the high frequency band is relatively abundant because the high frequency band in the narrow band reproduction frequency band is supported narrowly. Accordingly, the controller 110 may improve the reproduction for the high frequency band by decreasing the crossover frequency.

Figure 13A:
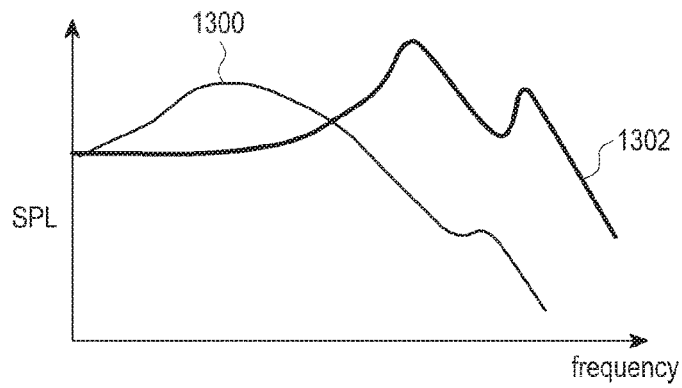
FIGS. 13A to 13C are diagrams illustrating simultaneous use of a dynamic receiver and a balanced armature in a narrow band reproduction frequency band, according to an embodiment of the present invention.
Figure 13B:
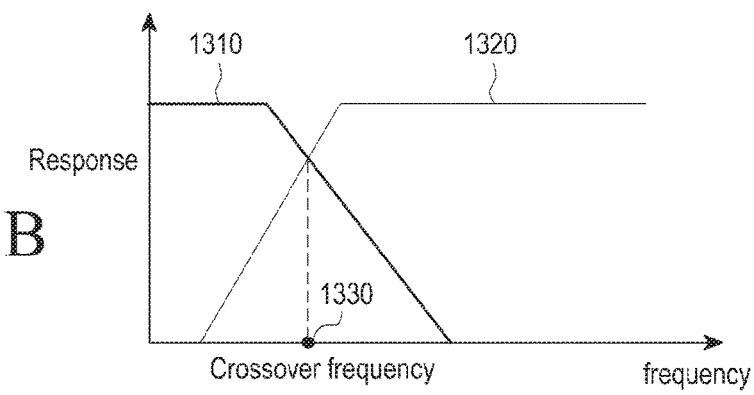
Figure 13C:
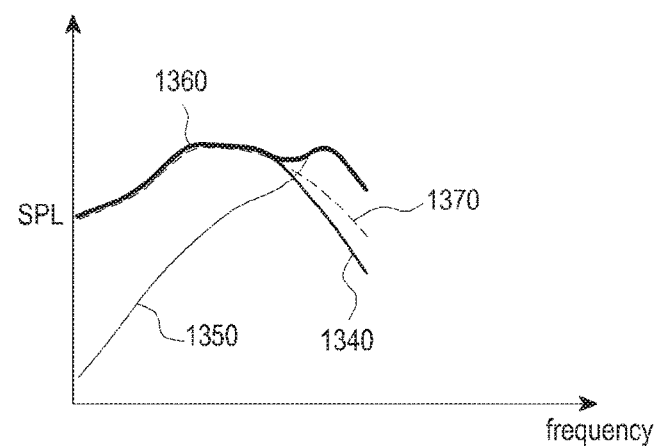

FIGS. 13A to 13C are diagrams illustrating a case where the dynamic receiver and the balanced armature are simultaneously used in the narrow band reproduction frequency band, according to an embodiment of the present invention. Referring to FIGS. 13A to 13C, a spectrum 1300 representing an SPL according to the frequency for the first audio output means 200 and a spectrum 1302 representing an SPL according to the frequency for the balanced armature 202 are illustrated in FIG. 13A. Further, a frequency response 1310 for the low pass filter used in the first audio output means 200 and a frequency response 1320 for the high pass filter used in the balanced armature 202 are illustrated in FIG. 13B. A frequency at a point at which the frequency response 1310 for the low pass filter used in the first audio output means 200 crosses the frequency response 1320 for the high pass filter used for the balanced armature 202 is illustrated as a crossover frequency 1330. The crossover frequency 1330 is decreased compared to the crossover frequency 1230 of FIG. 12B. This is a result of the improvement of the reproduction for the high frequency band by decreasing the crossover frequency by controlling the crossover frequency changing unit 900.

A spectrum 1340 representing an SPL according to the frequency for the first reproduction frequency band, a spectrum 1350 representing an SPL according to the frequency for the adjusted second reproduction frequency band, and a spectrum 1360 representing an SPL according to the frequency in which the first reproduction frequency band is combined with the second reproduction frequency band, are illustrated in FIG. 13C. As illustrated in FIG. 12C, according to another embodiment of the present invention, when the mobile apparatus is positioned in the narrow band reproduction region, not only the dynamic receiver but also the balanced armature are operated. Filtering is performed so that the high frequency band is abundantly reproduced, thereby outputting the reproduction of the audio data signal abundant even in the high frequency band compared to a spectrum 1370 representing an SPL according to the frequency at which only one dynamic receiver is operated.

The mobile apparatus, according to another embodiment of the present invention, may further include a surrounding environment noise determination unit for determining a noise for a surrounding environment of the mobile apparatus.

The surrounding environment noise determination unit may determine a noise of the surrounding environment by using the sensor module 170 or the microphone 162 included in the input/output module 160 of the mobile apparatus 100. Further, the surrounding environment noise determination unit may determine whether the noise belongs to the high frequency band or the low frequency band. Accordingly, when the surrounding environment noise determination unit determines that the noise of the surrounding environment of the mobile apparatus has a level greater than or equal to a predetermined level, the controller 110 may change the crossover frequency by controlling the crossover frequency changing unit 900. For example, a case where the dynamic receiver, which is the first audio output means, and the balanced armature are used is described in detail below.

When the surrounding environment noise determination unit determines that the noise belongs to the low frequency band, the controller 110 may increase the audio reproduction through the balanced armature 202 in which the reproduction for the high frequency band is effective by reducing the crossover frequency. On the contrary, when the surrounding environment noise determination unit determines that the noise belongs to the high frequency band, the controller 110 may increase the audio reproduction through the dynamic receiver, which is the first audio output means 200, in which the reproduction for the low frequency band is effective by increasing the crossover frequency. Further, when the noise belongs to the low frequency band, the controller 110 may apply the first filter used in the dynamic receiver, which is the first audio means, as a Band Pass Filter (BPS) by controlling the audio signal processor 310.

Figure 14:
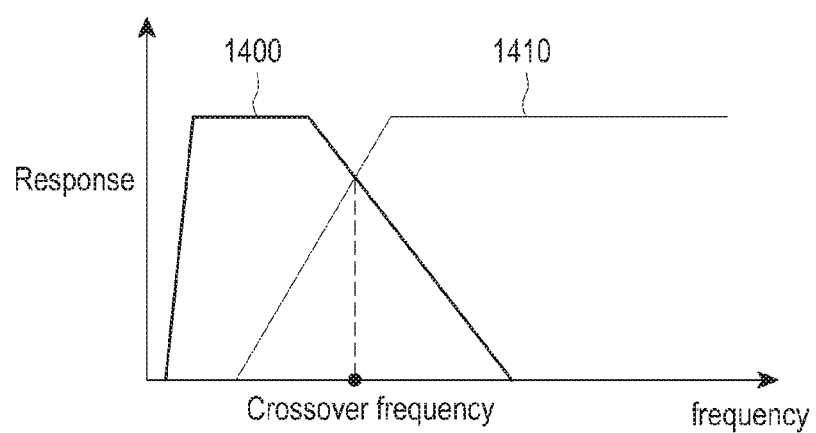
FIG. 14 is a diagram illustrating a frequency response used in the audio output means by a band pass filter, according to an embodiment of the present invention.

Accordingly, as illustrated in FIG. 14, according to another embodiment of the present invention, the band pass filter having a frequency response 1400 cutting the lowest range band is used for the dynamic receiver, which is the first audio output means 200, and the high pass filter is used for the balanced armature 202, thereby effectively reproducing the audio data signal at a surrounding area of an area in which the noise in the low frequency band is generated.

The mobile apparatus according to another embodiment of the present invention may further include a region determination unit for determining a country or a region in which the mobile apparatus is positioned.

The region determination unit may determine a country or a region in which the mobile apparatus is positioned by analyzing information on a base station connected with the mobile apparatus or a carrier by using the communication modules 120 and 132 of the mobile apparatus.

The controller 110 may change the crossover frequency by receiving information on the country or the region in which the mobile apparatus 100 is positioned from the region determination unit, and controlling the crossover frequency changing unit. For example, a case where the dynamic receiver, which is the first audio output means 200, and the balanced armature 202 are used is described in detail below.

When the controller 110 receives information indicating that the mobile apparatus is positioned in the United States of America (USA) from the region determination unit, the controller 110 may more abundantly reproduce the balanced armature 202 by decreasing the crossover frequency, according to a predetermined reference that a user in the USA prefers an audio data signal of a high frequency band. On the contrary, when the controller 110 receives information indicating that the mobile apparatus is positioned in Europe from the region determination unit, the controller 110 may more abundantly reproduce the dynamic receiver, which is the first audio output means 200, by increasing the crossover frequency, according to a predetermined reference that a user in Europe prefers an audio data signal of a low frequency band.

In the mobile apparatus including the balanced armature, according to another embodiment of the present invention, it is possible to change the crossover frequency by receiving an input for changing the crossover frequency from the reproduction frequency band adjustment input unit.

The reproduction frequency band adjustment input unit receives an input for adjusting the first reproduction frequency band of the first audio output means 200 and the second reproduction frequency band of the balanced armature 202, as described with reference to FIG. 11. An adjustment for changing the crossover frequency at which a frequency response of the first filter used for the adjustment of the reproduction frequency band of the first audio output means 200 crosses a frequency response of the second filter used for the adjustment of the reproduction frequency band of the balanced armature 202 may be input from the reproduction frequency band adjustment input unit. Further, the reproduction frequency band adjustment input unit may receive an input of the adjustment of the crossover frequency from the user by using the touch screen. For example, a case where the dynamic receiver, which is the first audio output means 200, and the balanced armature 202 are used is described in detail below.

Figure 15A:
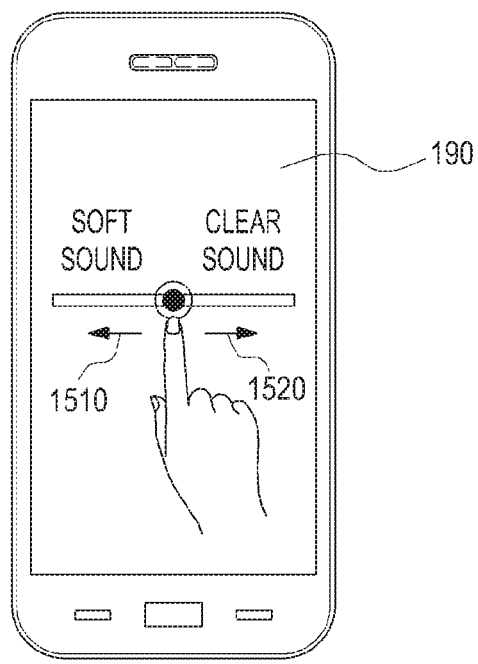
FIGS. 15A and 15B are diagrams illustrating a process of performing an adjustment of a reproduction frequency band, according to an embodiment of the present invention.
Figure 15B:
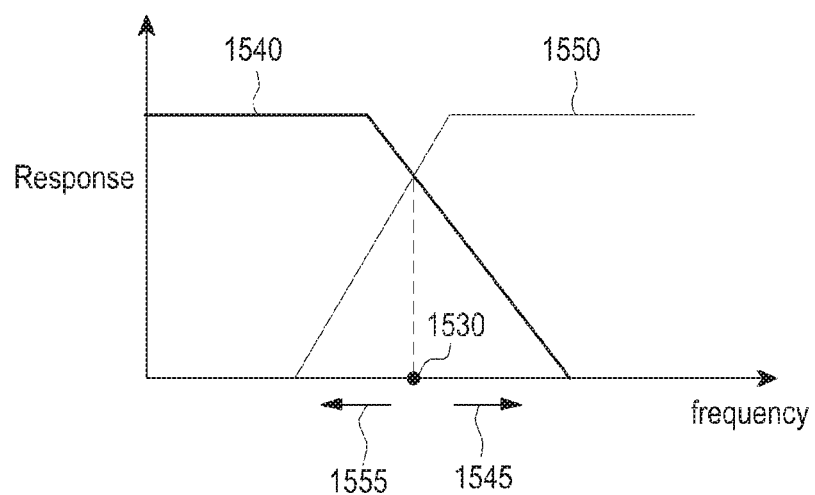

FIGS. 15A and 15B are diagrams illustrating a process of performing an adjustment of a reproduction frequency band, according to an embodiment of the present invention. Referring to FIG. 15A, when a user desires a soft sound, a touch toward the left 1510 may be input through the touch screen 190 included in the mobile apparatus. If a user desires a clear sound, a touch toward the right 1520 may be input through the touch screen 190 included in the mobile apparatus. The controller 110 detects the input touch, and when the left touch 1510 corresponding to the soft sound is detected, the controller 110 expands a frequency response 1540 of the low pass filter corresponding to the low frequency band by increasing a crossover frequency 1530 in a direction 1545, as illustrated in FIG. 15B, to abundantly reproduce the dynamic receiver corresponding to the first audio means 200. On the contrary, when the right touch 1520 corresponding to the clear sound is detected, the controller 110 expands a frequency response 1550 of the high pass filter corresponding to the high frequency band by decreasing the crossover frequency 1530 in a direction 1555, as illustrated in FIG. 15B, to abundantly reproduce the balanced armature.

According to another embodiment of the present invention, it is possible to reproduce an audio data signal desired by the user by receiving an input for a desired sound from the user and using the plurality of audio output means. For example, when the user makes a call using the mobile apparatus, the user may hear a desired audio data signal in accordance with a tone of a party of the call. When a phone conversation is difficult, the user may hear a desired audio data signal by adjusting the tone.

Figure 16:
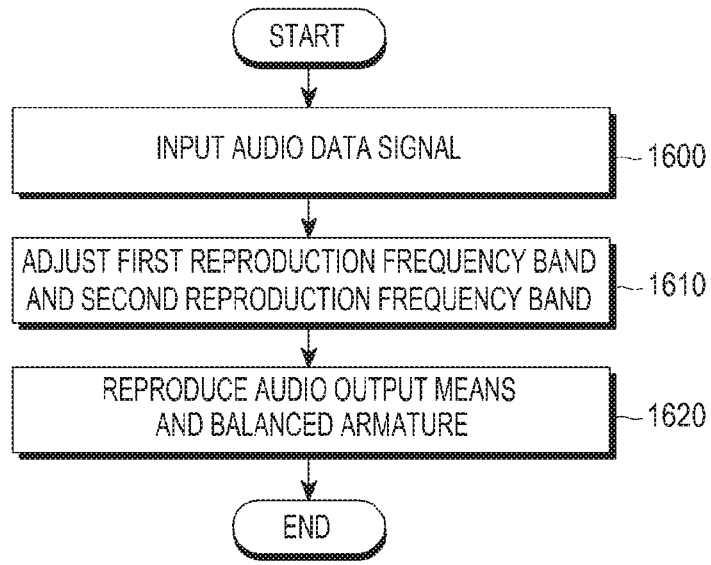
FIG. 16 is a flowchart illustrating a control method of the mobile apparatus, according to the embodiment of the present invention.

FIG. 16 is a flowchart illustrating a control method of the mobile apparatus, according to an embodiment of the present invention.

Referring to FIG. 16, an audio data signal is input that is reproduced in at least one audio output means and the balanced armature of the mobile apparatus, in step 1600.

A first reproduction frequency band of the first audio output means for reproducing a first reproduction frequency band of the audio data signal of the mobile apparatus, and a second reproduction frequency band of the balanced armature for reproducing a second reproduction frequency band of the audio data signal of the mobile apparatus, are adjusted by using at least one filter, in step 1610. At least one filter may perform filtering according to a frequency. For example, the reproduction frequency band may be adjusted by using the low pass filter in the first reproduction frequency band of the first reproduction frequency band of the first audio output means, and the reproduction frequency band may be adjusted by using the high pass filter in the second reproduction frequency band of the balanced armature. The first audio output means reproducing the first reproduction frequency band may be for reproducing a low frequency band, and the balanced armature reproducing the second reproduction frequency band may be for reproducing the high frequency band.

The audio data signal is output to the outside of the mobile apparatus by reproducing the first audio output means with the adjusted first reproduction frequency band and reproducing the balanced armature with the adjusted second reproduction frequency band, in step 1620. Specifically, the audio data signal is output to the outside of the mobile apparatus and provided to the user by reproducing a sound signal by reproducing the first audio output means with the adjusted first reproduction frequency band and reproducing the balanced armature with the adjusted second reproduction frequency band.

Figure 17:
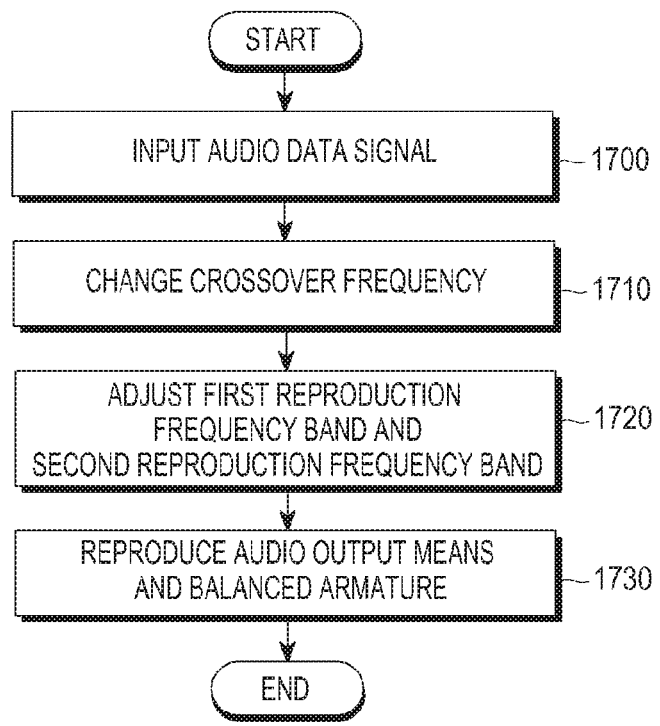
FIG. 17 is a flowchart illustrating a control method of the mobile apparatus, according to an embodiment of the present invention.

FIG. 17 is a flowchart illustrating a control method of the mobile apparatus, according to another embodiment of the present invention.

Referring to FIG. 17, an audio data signal is input for reproduction in at least one audio output means and the balanced armature, in step 1700.

A crossover frequency at which a frequency response of a first filter used for an adjustment of a reproduction frequency band of the first audio output means crosses a frequency response of a second filter used for an adjustment of a reproduction frequency band of the balanced armature is changed, in step 1710. The frequency response of the first filter and the frequency response of the second filter are changed by changing the crossover frequency.

A first reproduction frequency band of the first audio output means for reproducing a first reproduction frequency band of the audio data signal of the mobile apparatus and a second reproduction frequency band of the balanced armature for reproducing a second reproduction frequency band of the audio data signal of the mobile apparatus are adjusted by using at least one filter, in step 1720. The first reproduction frequency band of the first audio output means may be adjusted by using the first filter changed in step 1710, and the second reproduction frequency band of the balanced armature may be adjusted by using the second filter changed in step 1710. The first audio output means reproducing the first reproduction frequency band may be for reproducing a low frequency band, and the balanced armature reproducing the second reproduction frequency band may be for reproducing the high frequency band.

The audio data signal is output to the outside of the mobile apparatus by reproducing the first audio output means with the adjusted first reproduction frequency band and reproducing the balanced armature with the adjusted second reproduction frequency band, in step 1730. Specifically, the audio data signal is output to the outside of the mobile apparatus and provided to the user by reproducing a sound signal by reproducing the first audio output means with the adjusted first reproduction frequency band and reproducing the balanced armature with the adjusted second reproduction frequency band.

Figure 18:
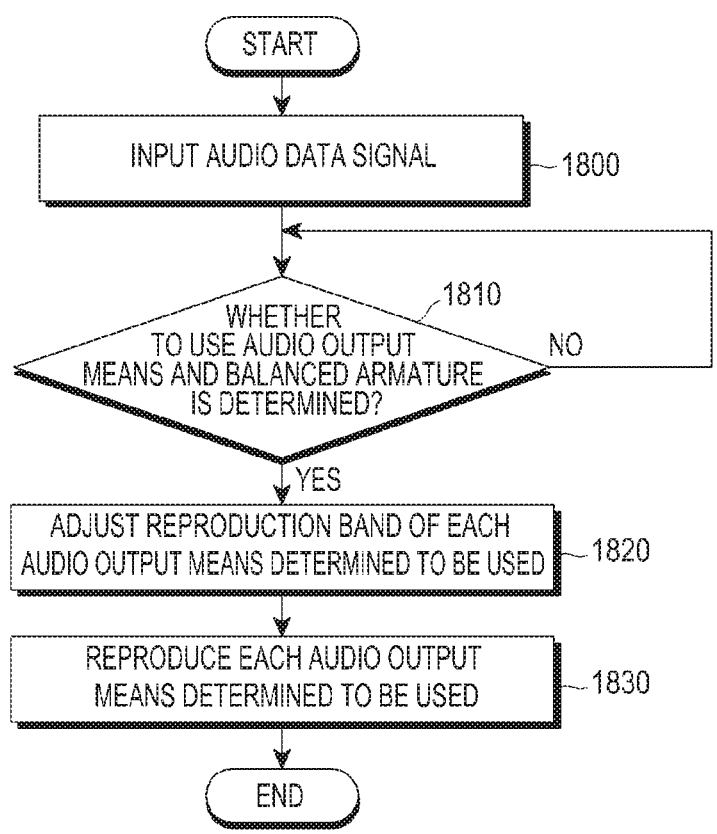
FIG. 18 is a flowchart illustrating a control method of the mobile apparatus, according to an embodiment of the present invention.

FIG. 18 is a flowchart illustrating a control method of the mobile apparatus, according to another embodiment of the present invention.

Referring to FIG. 18, an audio data signal is input for reproduction in at least one audio output means and the balanced armature of the mobile apparatus, in step 1800.

It is determined whether to use the first audio output means and the balanced armature, in step 1810. That is, a use or a non use of the first audio each of the first audio output means and the balanced armature. For example, when it is determined that the first audio output means is used and the balanced armature is not used, the audio data signal is reproduced and provided to the user only in the first audio output means A reproduction frequency band is adjusted by using at least one filter for each audio output means determined to be used, in step 1820. The at least one filter may perform filtering according to a frequency.

The audio data signal is output to the outside of the mobile apparatus by reproducing each audio output means determined to be used in the adjusted reproduction frequency band, in step 1830.

Figure 19:
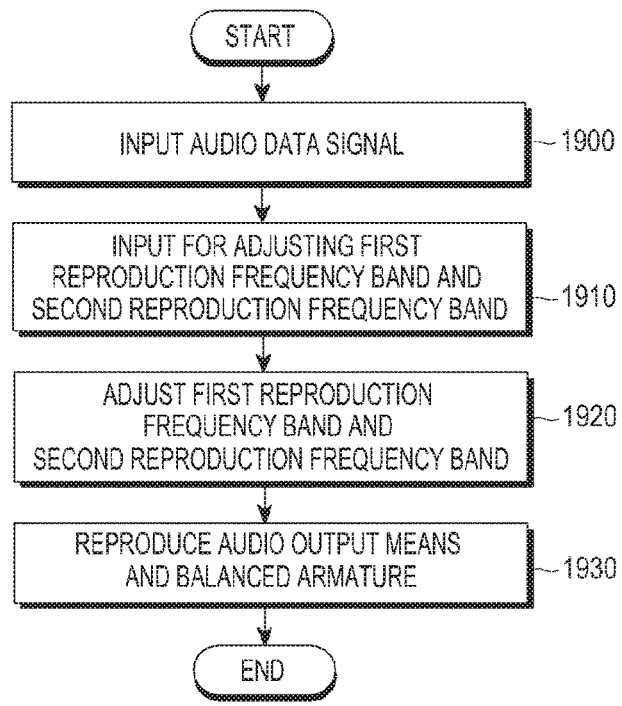
FIG. 19 is a flowchart illustrating a control method of the mobile apparatus, according to an embodiment of the present invention.

FIG. 19 is a flowchart illustrating a control method of the mobile apparatus, according to another embodiment of the present invention.

Referring to FIG. 19, an audio data signal is input for reproduction in at least one audio output means and the balanced armature of the mobile apparatus, in step 1900.

An input for adjusting a first reproduction frequency band of a first audio output means and a second reproduction frequency band of a balanced armature is received, in step 1910. The input may be received from the user.

The first reproduction frequency band of the first audio output means for reproducing the first reproduction frequency band of an audio data signal of the mobile apparatus and the second reproduction frequency band of the balanced armature for reproducing the second reproduction frequency band of the audio data signal of the mobile apparatus are adjusted to the reproduction frequency bands received in step 1910, respectively, by using at least one filter, in step 1920. In this case, at least one filter may perform filtering according to a frequency. For example, the reproduction frequency band may be adjusted by using the low pass filter in the first reproduction frequency band of the first reproduction frequency band of the first audio output means, and the reproduction frequency band may be adjusted by using the high pass filter in the second reproduction frequency band of the balanced armature.

The audio data signal is output to the outside of the mobile apparatus by reproducing the first audio output means with the adjusted first reproduction frequency band and reproducing the balanced armature with the adjusted second reproduction frequency band, in step 1930.

Figure 20:
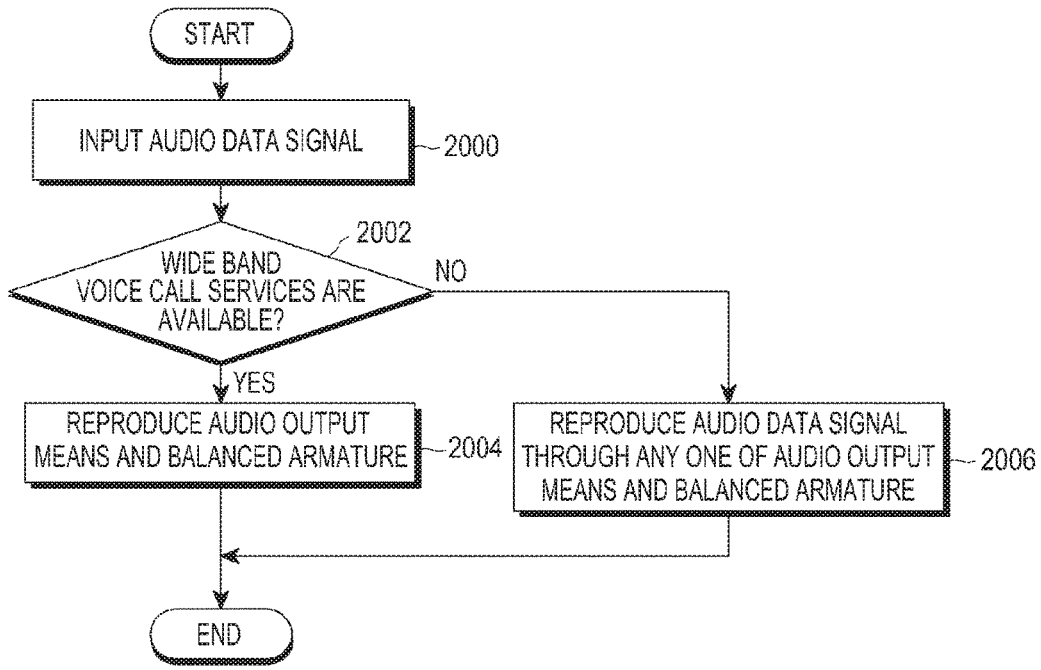
FIG. 20 is a flowchart illustrating a control method of the mobile apparatus, according to an embodiment of the present invention.

FIG. 20 is a flowchart illustrating a control method of the mobile apparatus, according to another embodiment of the present invention.

Referring to FIG. 20, an audio data signal is input for reproduction in at least one audio output means and the balanced armature of the mobile apparatus, in step 2000.

The controller 110 determines whether the wide band voice call services, in which a wide band reproduction frequency band is supported, are available in the mobile apparatus, in step 2002. The wide band reproduction frequency band has an audio data signal reproduction frequency band wider than a narrow band reproduction frequency band. Further, the controller 110 may determine whether voice channel information on the audio data signal is the wide band reproduction frequency band through communication with a base station or determining a carrier by using a communication module or the GPS module included in the mobile apparatus.

The controller 110 may reproduce the audio data signal through both the audio output means and the balanced armature, when the wide band voice call services are available in the mobile apparatus, in step 2004. For example, a case where the first audio output means reproducing the first reproduction frequency band is the dynamic receiver for reproducing a low frequency band, and the balance armature reproducing the second reproduction frequency band reproduces a high frequency band will is described in detail below.

When the wide band voice call services are available, the reproduction for a high range frequency band, as well as a low range frequency band, is supported. Accordingly, the controller 110 may reproduce the audio data signal for both the low range frequency band and the high range frequency band by reproducing the audio data signal through both the audio output means and the balanced armature.

However, the controller 110 may reproduce the audio data signal through any one of the audio output means and the balanced armature when the wide band voice call services are not available in the mobile apparatus, in step 2006. When the wide band voice call services are not available, reproduction is not supported to all of the low range frequency band and the high range frequency band, so that it is possible to reproduce the audio data signal through any one of the audio output means and the balanced armature.

It may be recognized that the embodiments of the present invention may be implemented with hardware, software, or a combination of hardware and software. The predetermined software may be stored in a volatile or nonvolatile storage device, such as ROM, a memory, such as RAM, a memory chip, a device, or an integrated circuit, or a storage medium, such as a CD, a DVD, a magnetic disk, or a magnetic tape, which may optically or magnetically records data and is simultaneously readable by a machine (e.g. a computer). It will be appreciated that the embodiments of the present invention may be implemented by a computer or a portable terminal including a controller and a memory, and the memory is one example of a machine readable storage medium appropriate for storing a program or programs including instructions implementing the embodiments of the present invention. Accordingly, the present invention includes a program including a code for implementing an apparatus and a method defined in any claim of the specification, and a machine (a computer, and the like) readable storage medium storing the program. Further, the program may be electronically transferred through a predetermined medium, such as a communication signal, transmitted through a wired or wireless connection, and the present invention appropriately includes an equivalent thereto.

Further, the mobile apparatus may receive the program from a wired or wirelessly connected program providing device and store the received program. The program providing device may include a program including instructions so as to perform the embodiments of the present invention, a memory for storing information necessary for the embodiments of the present invention, a communication unit for performing wired or wireless communication with the mobile apparatus, and a controller for transmitting a corresponding program to a transmission/reception device automatically or according to a request of the mobile apparatus.

While the present invention has been shown and described with reference to certain embodiments thereof, it will be understood by those skilled in the art that various changes in form and details may be made therein without departing from the spirit and scope of the present invention as defined by the appended claims.

What is claimed is:

1. An audio apparatus comprising:
a housing containing at least a filter, a dynamic driver and a balanced armature driver, and including an opening;
the filter disposed in the housing and adapted to pass a second frequency band of an audio signal;
the dynamic driver disposed in the housing and adapted to output a first sound corresponding to a first frequency band of the audio signal to the outside of the audio apparatus via the opening; and
the balanced armature driver disposed in the housing and adapted to output, by the filter, a second sound corresponding to the second frequency band of the audio signal to the outside via the opening of the housing,
wherein the first sound and the second sound are output together through the opening, and
wherein the dynamic driver and the balanced armature driver are disposed side-by-side facing the opening of the housing.

2. The audio apparatus of claim 1, wherein the filter comprises a high pass filter coupled with the balanced armature driver.

3. The audio apparatus of claim 2, further comprising:
another filter adapted to pass the first frequency band.

4. The audio apparatus of claim 3, wherein the another filter comprises a low pass filter coupled with the dynamic driver.

5. The audio apparatus of claim 1, wherein the balanced armature driver is in contact with the dynamic driver.

6. The audio apparatus of claim 1, further comprising:
a microphone to obtain a sound from the outside of the audio apparatus.

7. The audio apparatus of claim 6, further comprising:
an input module including at least one button to receive a user input to control the audio apparatus.

8. The audio apparatus of claim 7, further comprising:
a processor adapted to adjust the audio signal based at least in part on the sound.

9. An audio apparatus comprising:
a housing including an opening formed thereon;
an interface adapted to receive an audio signal;
a dynamic driver disposed at least partially in the housing and adapted to output a first sound corresponding to a first frequency band of the audio signal via the opening; and
a balanced armature driver disposed at least partially in the housing and adapted to output a second sound corresponding to a second frequency band of the audio signal via the opening,
wherein the balanced armature driver receives signal filtered by a filter, and adapted to pass the second frequency band, to output the second sound, and
wherein the dynamic driver and the balanced armature driver are disposed side-by-side in relation to the opening of the housing.

10. The audio apparatus of claim 9, wherein the filter is disposed in the audio apparatus.

11. The audio apparatus of claim 10, wherein the dynamic driver and the balanced armature driver output a corresponding sound of the first sound and the second sound concurrently.

12. The audio apparatus of claim 11, wherein the dynamic driver received signal filtered by another filter adapted to pass the first frequency band to output the first sound and wherein the first frequency band comprises a lower frequency band than the second frequency band.

* * * * *